United States Patent
Cho

(10) Patent No.: US 7,660,162 B2
(45) Date of Patent: Feb. 9, 2010

(54) CIRCUIT FOR MEASURING CURRENT IN A NAND FLASH MEMORY

(75) Inventor: Yong Deok Cho, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 427 days.

(21) Appl. No.: 11/751,590

(22) Filed: May 21, 2007

(65) Prior Publication Data

US 2008/0054877 A1    Mar. 6, 2008

(30) Foreign Application Priority Data

Sep. 4, 2006    (KR)    .................. 10-2006-0084765

(51) Int. Cl.
*G11C 16/06* (2006.01)

(52) U.S. Cl. ............. 365/185.21; 365/196; 365/189.15; 365/205; 365/189.08

(58) Field of Classification Search ............ 365/185.21, 365/196, 189.15, 205, 189.08
See application file for complete search history.

(56) References Cited

U.S. PATENT DOCUMENTS

| | | | | |
|---|---|---|---|---|
| 5,581,485 A | * | 12/1996 | Van Aken | .................. 702/158 |
| 5,835,406 A | * | 11/1998 | Chevallier et al. | ...... 365/185.03 |
| 6,937,510 B2 | * | 8/2005 | Hosono et al. | ......... 365/185.03 |
| 7,027,325 B2 | * | 4/2006 | Iwata | ......................... 365/158 |
| 7,190,621 B2 | * | 3/2007 | Redaelli et al. | .......... 365/185.2 |
| 7,233,514 B2 | * | 6/2007 | Curatolo et al. | ............. 365/100 |
| 7,239,551 B2 | * | 7/2007 | Cernea et al. | ............. 365/185.21 |
| 7,244,618 B2 | * | 7/2007 | Happe | ......................... 436/71 |
| 7,301,808 B2 | * | 11/2007 | Li et al. | ................. 365/185.03 |
| 7,345,905 B2 | * | 3/2008 | Pio et al. | ..................... 365/100 |

FOREIGN PATENT DOCUMENTS

| | | |
|---|---|---|
| JP | 03-147596 A | 6/1991 |
| JP | 09-293387 A | 11/1997 |
| JP | 2003-203488 A | 7/2003 |
| KR | 1020000019369 A | 4/2000 |
| KR | 1020010001974 A | 1/2001 |
| KR | 1020020057687 A | 7/2002 |
| KR | 1020050118332 A | 12/2005 |

* cited by examiner

*Primary Examiner*—Viet Q Nguyen
(74) *Attorney, Agent, or Firm*—Townsend and Townsend and Crew LLP

(57) ABSTRACT

A circuit measures current passing through a memory cell in a NAND flash memory. The circuit includes a decoder and an analog mixer. The decoder is configured to select at least one data line coupled to page buffers and column decoders in accordance with a controlling signal. The analog mixer is configured to output current passing through the selected data line, or to couple all of the data lines to a means for measuring current in accordance with a total current measurement controlling signal.

13 Claims, 4 Drawing Sheets

CIRCUIT FOR MEASURING CURRENT IN A NAND FLASH MEMORY

CROSS-REFERENCE TO RELATED APPLICATIONS

This application claims priority from Korean Patent Application No. 2006-84765, filed on Sep. 4, 2006, the contents of which are incorporated herein by reference in its entirety.

BACKGROUND OF THE INVENTION

The present invention relates to a circuit for measuring current through a memory cell in a NAND flash memory. More particularly, the present invention relates to a circuit for effectively measuring the total current flowing through bit lines in a NAND flash memory.

A NAND flash memory is a semiconductor memory device which electrically programs and erases a memory cell, and does not require a refresh function when periodically rewriting data. A NAND flash memory device includes a page buffer for temporarily storing mass storage information or for reading the stored information.

The page buffer receives mass storage data from an input/output pad, and then provides the received data to memory cells. In addition, the page buffer stores data from the memory cells, and then outputs the stored data.

Hereinafter, a conventional circuit for measuring current through a memory cell during manufacture or testing of a NAND flash memory device will be described.

FIG. 1 is a block diagram illustrating a conventional circuit for measuring current in a NAND flash memory device. The NAND flash memory device includes a memory cell array (not shown), a page buffer section 10, a column decoder section 20, a multiplexer 30, a bypass section 40 and an IO pad section 50. The page buffer section 10 has first to eighth page buffers for programming data, and verifying and reading the memory cell array. The column decoder section 20 includes first to eighth column decoders. The multiplexer 30 selects one of data lines DMADATA (Direct Memory Data) <0:7> that is connected to an output terminal of the column decoder section 20.

The page buffer section 10 senses and latches bit lines BLo or BLe when programming data in the memory cell array or reading data from the memory cell. The column decoder section 20 selects a specific bit line.

The multiplexer 30 outputs only one signal (DMAOUT) from the data lines DMADATA<0:7> that are output from the first to eighth column decoders of the column decoder section 20. The signal is output from the multiplexer 30 in accordance with selecting signals TMDMA<0:2>. to minimize the number of lines required to measure current through the memory cell.

The bypass section 40 provides the signal DMAOUT output from the multiplexer 30 to the IO pad section 50 during a current measuring test mode. The bypass section 40 prevents the passage of the signal DMAOUT to the IO pad section 50 during other modes.

The IO pad section 50 is physically connected to a channel of a measurement apparatus. Thus, the measurement apparatus may directly measure current through the memory cell.

In the circuit for measuring current, the multiplexer 30 selects one of the data lines DMADATA<0:7> connected to the page buffer section 10 and the column decoder section 20. The multiplexer 30 outputs the current through the selected data line. Then, the measurement apparatus measures the current output from the multiplexer 30 and flowing through the IO pad section 50.

FIG. 2 illustrates detailed circuitry of the multiplexer in FIG. 1. The multiplexer 30 includes a decoder 31 and a digital multiplexer 32.

The decoder 31 decodes test mode signals TMDMA<0:2> when measuring the current. The decoder 31 then generates selecting signals D<0:7> for selecting one of the signals of the eight data lines DMADATA<0:7>.

The digital multiplexer 32 outputs current of the corresponding data line through its output line in accordance with a decoding value of a test mode signal.

The circuit in FIG. 2 measures the current through only one data line corresponding to a mode value of test mode signals TMDMA<0:2> of the multiplexer 30 in a measuring current mode. Hence, to measure a sum of currents passing through the memory cells, the circuit measures each current by sequentially changing mode values of the test mode signals TMDMA<0:2>, and then calculating the sum of the measured currents.

The above circuit for measuring the current by sequentially measuring the current through each data line and then calculating the sum of the currents is time inefficient. Additionally, current measurement error values of the measurement apparatus may be continuously omitted when calculating the sum of the currents.

BRIEF SUMMARY OF THE INVENTION

It is a feature of the present invention to provide a circuit for measuring current in a NAND flash memory device by measuring the total current of every memory cell in the NAND flash memory simultaneously.

A circuit for measuring current in a NAND flash memory comprising a memory cell array for storing data, page buffers for programming data in the memory cell array or for reading data from the memory cell array, and column decoders, according to one embodiment of the present invention includes a decoder and an analog mixer. The decoder is configured to generate a selecting signal for selecting data output through the column decoders. The analog mixer includes a first switching section, a second switching section and a current mirror. The first switching section provides the selected data to a first output terminal. The second switching section provides all of the data output from the column decoders to the first output terminal in accordance with a total current measurement controlling signal. The current mirror provides current having the same magnitude as the current passing through the first output terminal to a second output terminal.

The current mirror includes a first P-MOS transistor and a second P-MOS transistor. A source of the first P-MOS transistor is coupled to a power supply voltage. A drain of the first P-MOS transistor is coupled to the first output terminal and to a gate of the first P-MOS transistor. A gate of the second P-MOS transistor is coupled to the gate of the first P-MOS transistor. A drain of the second P-MOS transistor is coupled to the second output terminal.

When the NAND flash memory has a plurality of planes, the analog mixer is included in each of the planes.

The analog mixer is operated by a plane selecting signal.

A circuit for measuring current in a NAND flash memory comprising a memory cell array for storing data, page buffers for programming data in the memory cell array or for reading data from the memory cell array, and column decoders, according to another embodiment of the present invention includes a decoder and an analog mixer. The decoder is configured to select at least one data line coupled to the page buffers and the column decoders in accordance with a controlling signal. The analog mixer is configured to output current passing through the selected data line, or to output current passing through every data line in accordance with a total current measurement controlling signal.

The analog mixer includes a first switching section, a second switching section and a current mirror. The first switching section is configured to couple the selected at least one data line to a first output terminal. The second switching section is configured to couple every data line to the first output terminal in accordance with the total current measurement controlling signal. The current mirror is coupled to the first output terminal. The current mirror is configured to output current having the same magnitude as the current passing through the first output terminal to a second output terminal.

The current mirror includes a first P-MOS transistor and a second P-MOS transistor. A source of the first P-MOS transistor is coupled to a power supply voltage. A drain of the first P-MOS transistor is coupled to the first output terminal and to a gate of the first P-MOS transistor. A gate of the second P-MOS transistor is coupled to the gate of the first P-MOS transistor. A drain of the second P-MOS transistor is coupled to the second output terminal.

When the NAND flash memory has a plurality of planes, the analog mixer is included in each of the planes.

The analog mixer is operated by a plane selecting signal.

A circuit for measuring current in a NAND flash memory comprising a memory cell array for storing data, page buffers for programming data in the memory cell array or reading data from the memory cell array, and column decoders, according to still another embodiment of the present invention includes an analog mixer and a current mirror. The analog mixer is configured to have a switching section for providing all of the data output from the column decoders to a first output terminal in accordance with a total current measurement controlling signal. The current mirror provides current having the same magnitude as current passing through the first output terminal to a second output terminal.

The current mirror includes a first P-MOS transistor and a second P-MOS transistor. A source of the first P-MOS transistor is coupled to a power supply voltage. A drain of the first P-MOS transistor is coupled to the first output terminal and to a gate of the first P-MOS transistor. A gate of the second P-MOS transistor is coupled to the gate of the first P-MOS transistor. A drain of the second P-MOS transistor is coupled to the second output terminal.

When the NAND flash memory has a plurality of planes, the analog mixer is included in each of the planes.

The analog mixer is operated by a plane selecting signal.

As described above, the circuit for measuring current in the NAND flash memory of the present invention measures the sum of currents passing through every data line as well as current of the memory cell passing through each of data lines. Thus, testing time for the NAND flash memory cell is reduced, and the measurement apparatus is less prone to error. Accordingly, the circuit may quickly and accurately measure the current of the memory cell.

BRIEF DESCRIPTION OF THE DRAWINGS

The above and other features and advantages of the present invention will become readily apparent by reference to the following detailed description when considered in conjunction with the accompanying drawings, wherein.

DESCRIPTION OF SPECIFIC EMBODIMENTS

The preferred embodiments of the present invention will be explained in detail with reference to the accompanying drawings.

Figure 1:
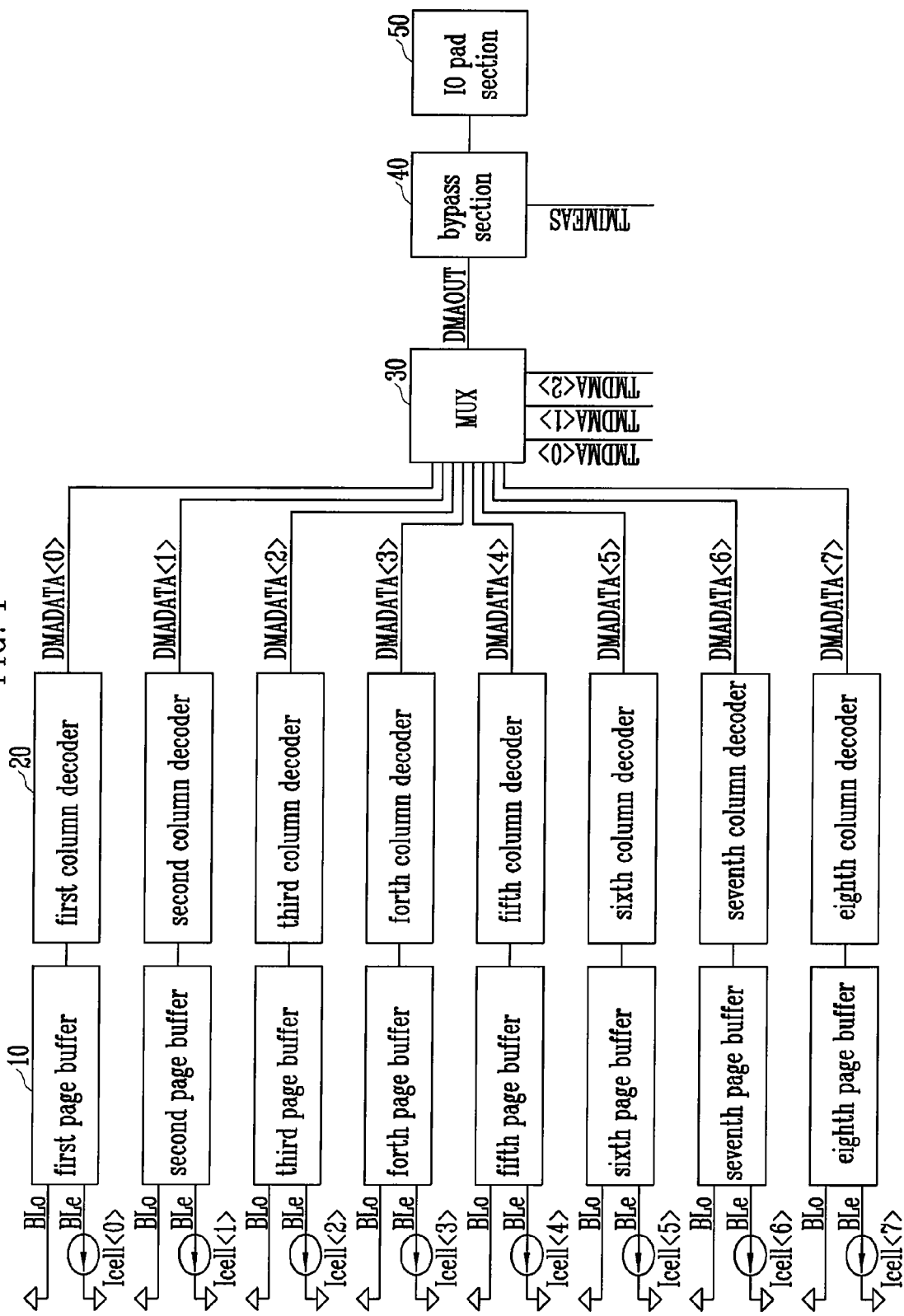
FIG. 1 is a block diagram illustrating a conventional circuit for measuring current in a NAND flash memory device.
Figure 2:
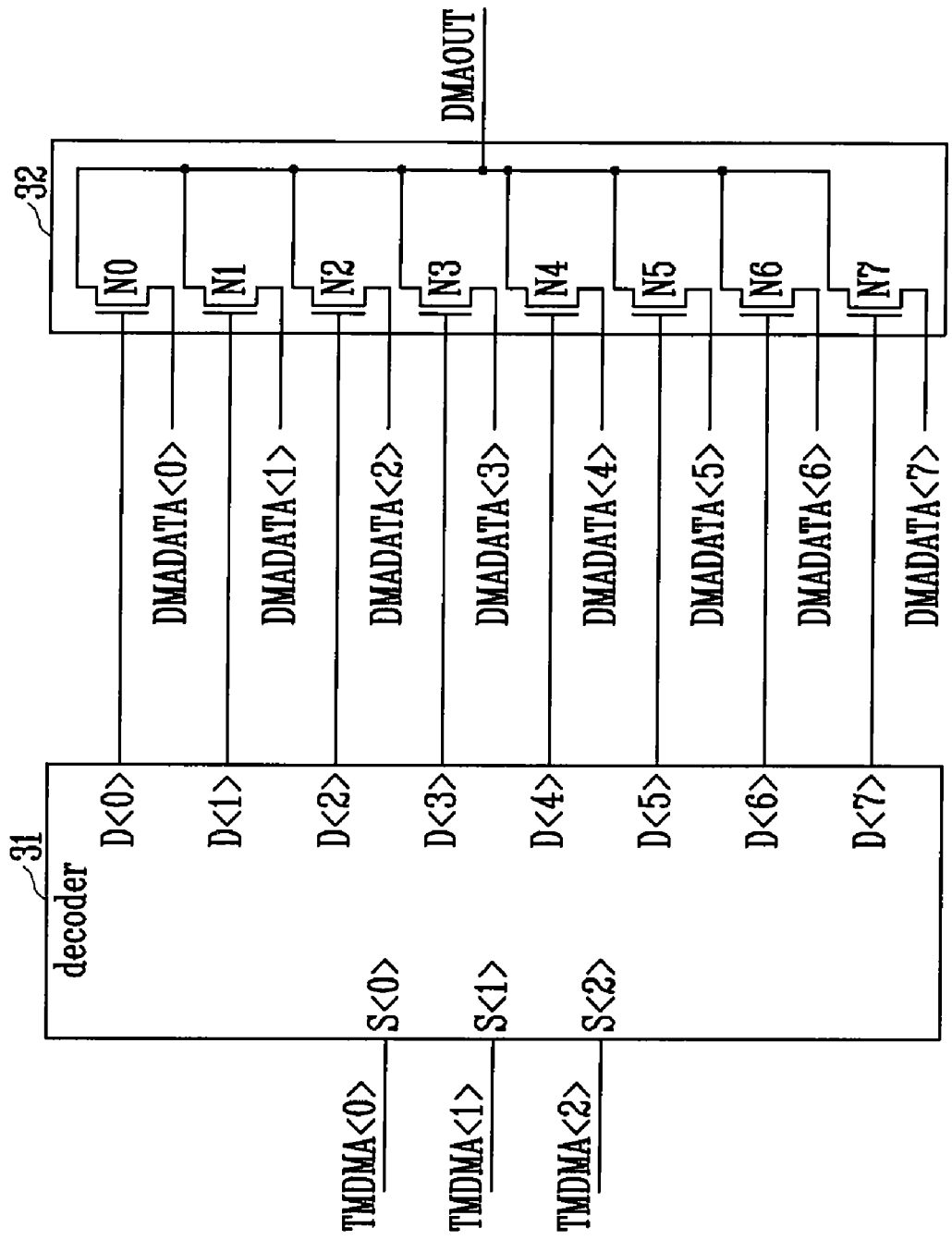
FIG. 2 illustrates the circuitry of a multiplexer of the conventional circuit of FIG. 1.
Figure 3:
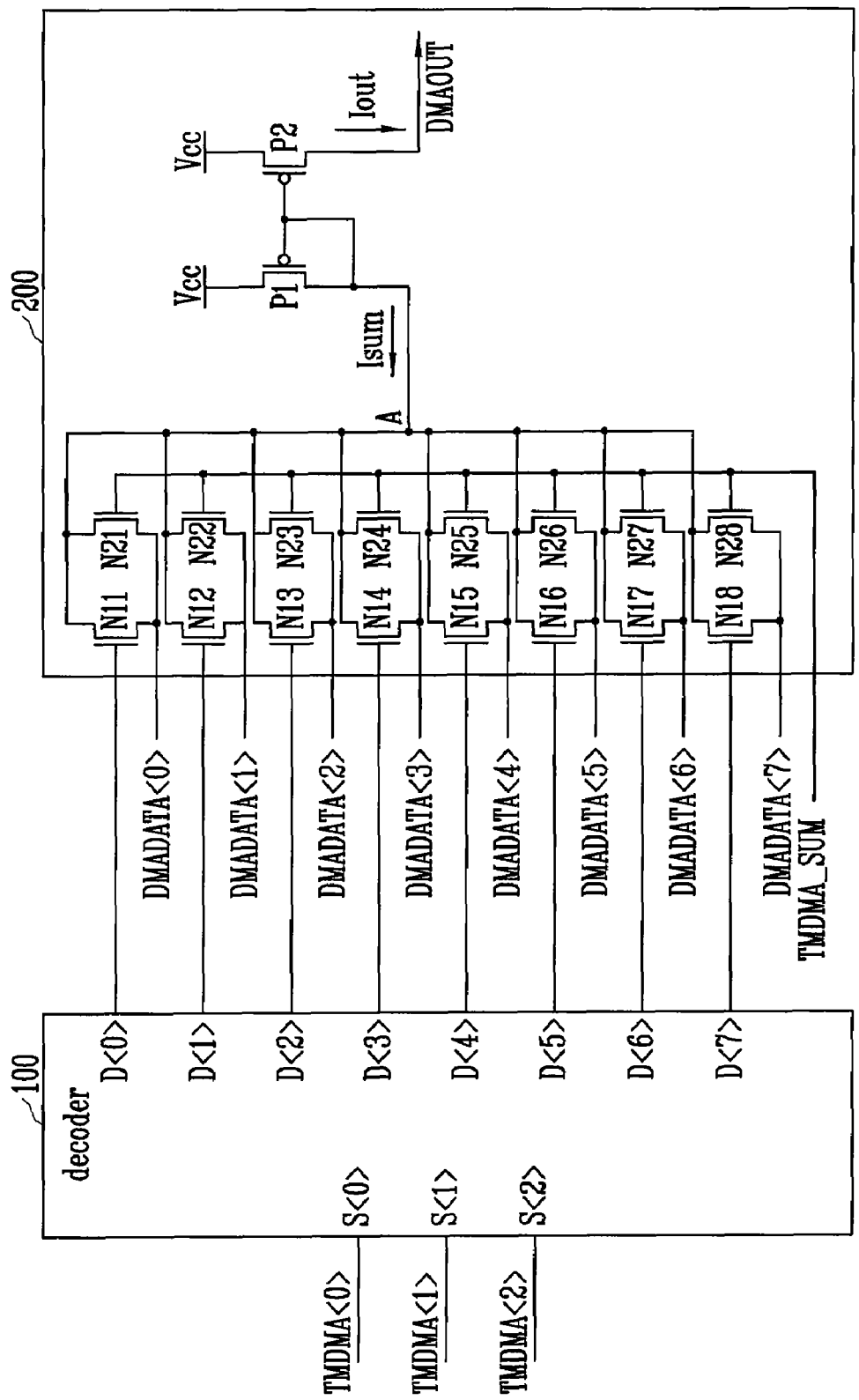
FIG. 3 illustrates the circuitry of a circuit for measuring current in a NAND flash memory according to a first embodiment of the present invention.

FIG. 3 illustrates detailed circuitry of a circuit for measuring current in a NAND flash memory according to a first embodiment of the present invention.

The circuit for measuring current of the present embodiment includes a memory cell array (not shown), page buffers (not shown), a decoder 100 and an analog mixer 200. The decoder 100 and the analog mixer 200 are used for measuring current passing through data lines DMADATA<0:7> from a column decoder (not shown).

The decoder 100 selects one of eight data lines DMADATA<0:7> in response to test mode signals TMDMA<0:2>.

The analog mixer 200 outputs current corresponding to the data line selected by the decoder 100, and includes a current mirror. Current passing through each data line DMADATA<0:7> is output through the current mirror when a controlling signal TMDMA_SUM is input to the analog mixer 200. The controlling signal TMDMA_SUM enables measurement of the sum of the currents through the data lines DMADATA<0:7>. The output currents are then measured by a following measurement apparatus. Specifically, the analog mixer 200 includes first to eighth N-MOS transistors N11 to N18 which operate by selecting signals D<0:7> output from the decoder 100. The analog mixer 200 also includes ninth to sixteenth N-MOS transistors N21 to N28 which are activated by the controlling signal TMDMA_SUM. The analog mixer 200 further includes first and second P-MOS transistors P1 and P2 which form the current mirror.

The first to eighth N-MOS transistors N11 to N18 are activated/deactivated in accordance with the selecting signals D<0:7> output from the decoder 100. In this case, a data line corresponding to the activated N-MOS transistor of the data lines DMADATA<0:7> is coupled to a node A. As a result, current Iout corresponding to the data line coupled to the node A is output from the current mirror.

For example, when the test mode signal TMDMA<0:2> is set to '001', a selecting signal D<4> has a high level such that the fifth N-MOS transistor N15 is activated by the selecting signal D<4>. Thus, the data line DMADATA<4> is coupled to the node A such that current Isum passes to the node A. In this case, the current Iout has the same magnitude as the current Isum in accordance with characteristics of the current mirror. Iout is output from the current mirror to an output DMAOUT. Accordingly, current passing through the data line DMADATA<4> may be measured by detecting the output current Iout.

When measuring the sum of currents through every data line DMADATA<0:7>, the ninth to sixteenth N-MOS transistors N21 to N28 are activated when the controlling signal TMDMA_SUM is input to the analog mixer 200. As a result, every data line DMADATA<0:7> is coupled to the node A irrespective of the operation of the decoder 100. Thus, the current Isum is substantially identical to the sum of the currents through the data lines DMADATA<0:7>. In this case, since the current Iout is identical to the current Isum due to the characteristics of the current mirror, the current provided to the output DMAOUT also has the same magnitude as the sum of the currents passing through the data lines DMADATA<0: 7>.

The circuit for measuring current described with reference to in FIG. 3 measures current flowing through the data lines (DMADATA<0:7>) when the NAND flash memory has one plane structure. However, the NAND flash memory usually has at least two plane structures. Therefore, a circuit for measuring current suitable for more than one plane structure is provided below.

Figure 4:
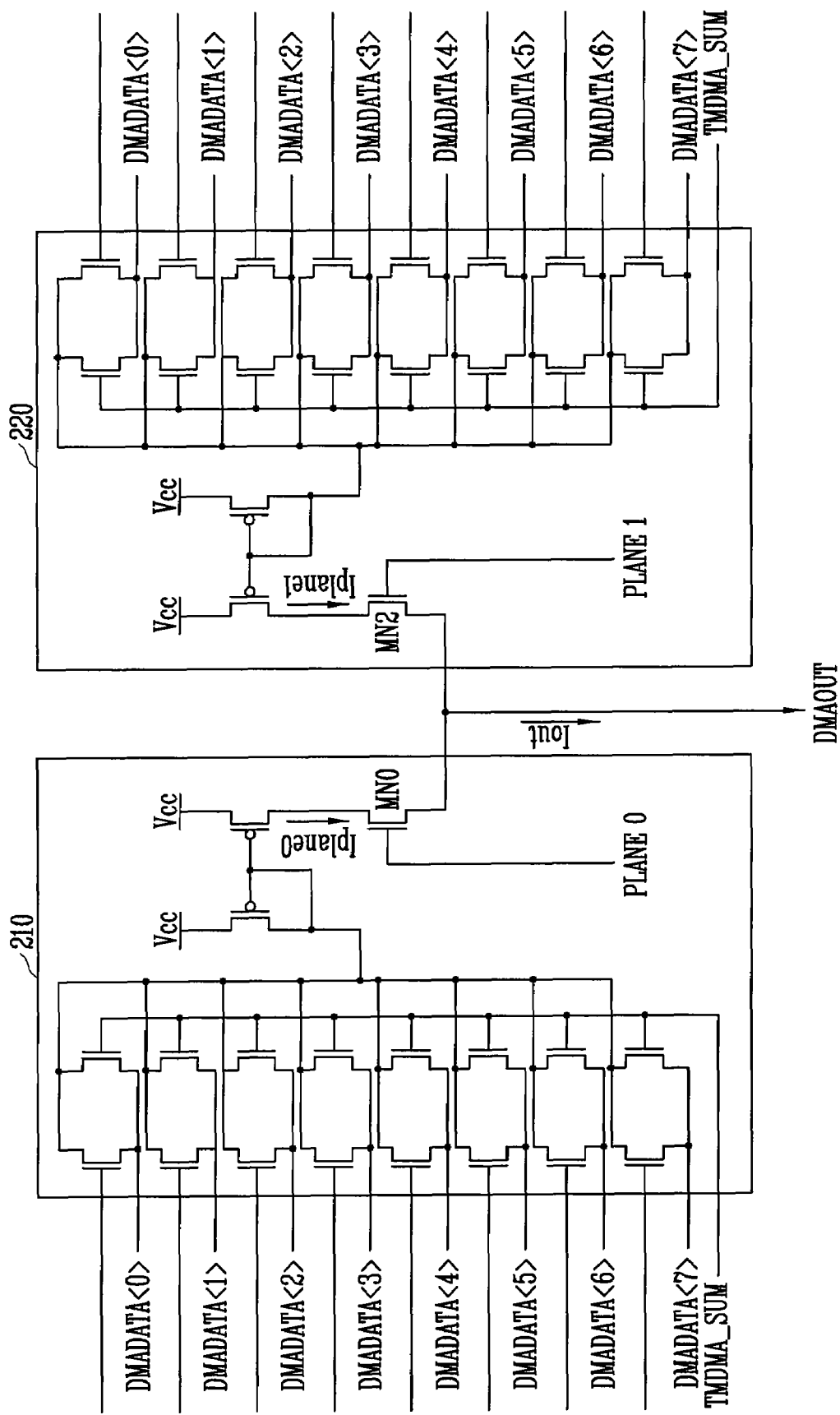
FIG. 4 illustrates the circuitry of a circuit for measuring current in a NAND flash memory according to a second embodiment of the present invention.

FIG. 4 illustrates detailed circuitry of a circuit for measuring current in a NAND flash memory according to a second embodiment of the present invention.

Each of the planes includes an analog mixer having a current mirror as shown in FIG. 3. In other words, the circuit for measuring current has a first analog mixer 210 for a first plane and a second analog mixer 220 for a second plane. The circuit includes a memory cell array, page buffers, a column decoder and a decoder (not shown in FIG. 4).

The first and second analog mixers 210 and 220 further include N-MOS transistors MN1 and MN2 operated by plane selecting signals PLANE0 and PLANE1. The N-MOS transistors output current Iout corresponding to output of the current mirror (i.e., Iplane0 and/or Iplane1) to an output DMAOUT. For example, the N-MOS transistor MN1 or MN2 is activated in accordance with the plane selecting signal PLANE0 or PLANE1. Thus, the current Iplane0 or Iplane1 corresponding to the activated N-MOS transistor is output from the corresponding analog mixer to the output DMAOUT.

In another example, the N-MOS transistors MN1 and MN2 are activated in accordance with the plane selecting signals PLANE0 and PLANE1. Thus, the sum of the currents flowing through the planes may be measured by detecting the current Iout.

Any reference in this specification to "one embodiment," "an embodiment," "example embodiment," etc., means that a particular feature, structure, or characteristic described in connection with the embodiment is included in at least one embodiment of the invention. The appearance of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A circuit for measuring current in a NAND flash memory comprising a memory cell array for storing data, page buffers for programming data in the memory cell array or for reading data from the memory cell array, and column decoders, the circuit for measuring current comprising:

a decoder configured to generate a selecting signal for selecting data output through the column decoders; and an analog mixer comprising a first switching section for providing the selected data to a first output terminal, a second switching section for providing the data output from the column decoders to the first output terminal in accordance with a total current measurement controlling signal, and a current mirror for providing current having the same magnitude as current passing through the first output terminal to a second output terminal.

2. The circuit of claim 1, wherein the current mirror includes:

a first P-MOS transistor, wherein a source of the first P-MOS transistor is coupled to a power supply voltage, a drain of the first P-MOS transistor is coupled to the first output terminal, and the drain of the first P-MOS transistor is coupled to a gate of the first P-MOS transistor; and a second P-MOS transistor, wherein a gate of the second P-MOS transistor is coupled to the gate of the first P-MOS transistor, and a drain of the second P-MOS transistor is coupled to the second output terminal.

3. The circuit of claim 1, wherein when the NAND flash memory comprises a plurality of planes, the analog mixer being included in each of the planes.

4. The circuit of claim 3, wherein the analog mixer is operated by a plane selecting signal.

5. A circuit for measuring current in a NAND flash memory comprising a memory cell array for storing data, page buffers for programming data in the memory cell array or for reading data from the memory cell array, and column decoders, the circuit for measuring current comprising:

a decoder configured to select at least one data line coupled to the page buffers and the column decoders in accordance with a controlling signal; and an analog mixer configured to output current passing through the selected data line, or output currents passing through every data line in accordance with a total current measurement controlling signal.

6. The circuit of claim 5, wherein the analog mixer includes:

a first switching section configured to couple the selected data line to a first output terminal;

a second switching section configured to couple every data line to the first output terminal in accordance with the total current measurement controlling signal; and a current mirror coupled to the first output terminal, and configured to output current having the same magnitude as current passing through the first output terminal to a second output terminal.

7. The circuit of claim 6, wherein the current mirror includes:

a first P-MOS transistor, wherein a source of the first P-MOS transistor is coupled to a power supply voltage, a drain of the first P-MOS transistor is coupled to the first output terminal, and the drain of the first P-MOS transistor is coupled to a gate of the first P-MOS transistor; and a second P-MOS transistor, wherein a gate of the second P-MOS transistor is coupled to the gate of the first P-MOS transistor, and a drain of the second P-MOS transistor is coupled to the second output terminal.

8. The circuit of claim 5, wherein when the NAND flash memory comprises a plurality of planes, the analog mixer being included in each of the planes.

9. The circuit of claim 8, wherein the analog mixer is operated by a plane selecting signal.

10. A circuit for measuring current in a NAND flash memory comprising a memory cell array for storing data, page buffers for programming data in the memory cell array or for reading data from the memory cell array, and column decoders, the circuit for measuring current comprising:

an analog mixer configured to have a switching section for providing all of the data output from the column decoders to a first output terminal in accordance with a total current measurement controlling signal, and a current mirror for providing current having the same magnitude as current passing through the first output terminal to a second output terminal.

11. The circuit of claim 10, wherein the current mirror includes:

a first P-MOS transistor, wherein a source of the first P-MOS transistor is coupled to a power supply voltage, a drain of the first P-MOS transistor is coupled to the first output terminal, and the drain of the first P-MOS transistor is coupled to a gate of the first P-MOS transistor; and a second P-MOS transistor, wherein a gate of the second P-MOS transistor is coupled to the gate of the first P-MOS transistor, and a drain of the second P-MOS transistor is coupled to the second output terminal.

12. The circuit of claim 10, wherein when the NAND flash memory comprises a plurality of planes, the analog mixer being included in each of the planes.

13. The circuit of claim 10, wherein the analog mixer is operated by a plane selecting signal.

* * * * *